US007613076B2

(12) United States Patent
Larson, III et al.

(10) Patent No.: US 7,613,076 B2
(45) Date of Patent: Nov. 3, 2009

(54) ACOUSTIC POWER TRANSFORMER INCLUDING LENS

(75) Inventors: John D. Larson, III, Palo Alto, CA (US); Michael L. Frank, Menlo Park, CA (US); Mark A. Unkrich, Redwood City, CA (US); Stephen R. Gilbert, San Francisco, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 4 days.

(21) Appl. No.: 11/755,825

(22) Filed: May 31, 2007

(65) Prior Publication Data

US 2008/0297282 A1 Dec. 4, 2008

(51) Int. Cl.
*G01S 13/00* (2006.01)

(52) U.S. Cl. .................. 367/151; 310/335; 310/359

(58) Field of Classification Search .............. 310/335, 310/359; 367/151
See application file for complete search history.

(56) References Cited

U.S. PATENT DOCUMENTS

| | | | | |
|---|---|---|---|---|
| 5,974,884 A | * | 11/1999 | Sano et al. ................. | 73/589 |
| 6,272,922 B1 | * | 8/2001 | Stevens et al. ............. | 73/290 V |
| 6,978,028 B2 | * | 12/2005 | Fink et al. ................. | 381/77 |
| 7,038,358 B2 | * | 5/2006 | Bryant et al. .............. | 310/365 |
| 2002/0009631 A1 | * | 1/2002 | Yoshinaka et al. .......... | 429/94 |
| 2006/0056274 A1 | * | 3/2006 | Neeson et al. ............. | 367/138 |

* cited by examiner

*Primary Examiner*—Walter Benson
*Assistant Examiner*—Bryan P Gordon

(57) ABSTRACT

An acoustic power transformer includes: an input port adapted to receive an input signal; a transmitting acoustic transducer coupled to the input port and adapted to transmit an acoustic wave in response to the input signal received at the input port; a receiving acoustic transducer adapted to receive the acoustic wave and in response thereto to produce an output signal; an output port adapted to output the output signal; and an acoustic medium disposed in an acoustic wave propagation path between the transmitting acoustic transducer and the receiving acoustic transducer. In one case, at least one of the transmitting acoustic transducer and receiving acoustic transducer includes a Fresnel lens. In another case, the transformer includes an acoustic lens disposed in the acoustic wave propagation path between the transmitting acoustic transducer and the receiving acoustic transducer.

17 Claims, 4 Drawing Sheets

ACOUSTIC POWER TRANSFORMER INCLUDING LENS

BACKGROUND

In many applications there is a need for coupling high frequency (e.g., radio frequency (RF) or microwave) energy between two circuits while providing some measure of DC or low frequency electrical isolation between the circuits. Transformers are commonly employed to provide this function. One class of devices that may be employed for such a transformer include acoustic processing devices, such as a bulk acoustic wave (BAW) devices and thin film acoustic wave devices.

FIGS. 1A-B illustrate an exemplary acoustic power transformer 100. Acoustic power transformer 100 includes an input port 102, an output port 104, a transmitting acoustic transducer 110, a receiving acoustic transducer 120, and an acoustic wave propagation medium 130 disposed in an acoustic wave propagation path between transmitting acoustic transducer 110 and receiving acoustic transducer 120.

Transmitting acoustic transducer 110 and receiving acoustic transducer 120 may be piezoelectric devices adapted to convert a high frequency signal (e.g., an RF or microwave signal) to an acoustic wave, and vice versa. In one embodiment, transmitting acoustic transducer 110 and receiving acoustic transducer 120 each comprise a small "patch" of Lead Zirconate Titanate (PZT) material, for example 1 mm×1 mm square patch.

Acoustic wave propagation medium 130 may be a material such as alumina.

Input port 102 includes a first and second terminal connected, respectively, to first and second electrodes of transmitting acoustic transducer 110. Output port 104 includes a first and second terminal connected, respectively, to first and second electrodes of receiving acoustic transducer 120.

In operation, an input signal (e.g., an RF or microwave signal) is applied to input port 102 and thereby applied across the electrodes of transmitting acoustic transducer 110. In response to the input signal, transmitting acoustic transducer 110 generates an acoustic wave which is launched into the acoustic wave propagation medium 130. The receiving acoustic transducer 120 receives the acoustic wave and in response thereto, generates an output signal (e.g., an RF or microwave signal) which is applied to output port 104.

In this manner, acoustic power transformer 100 is able to transfer high frequency energy from input post 102 to output port 104 while maintaining DC isolation between the two ports.

However, acoustic power transformer 100 has some drawbacks.

In particular, when the acoustic wave is launched from transmitting acoustic transducer 110, in the "near field" near the transmitting acoustic transducer 110 it appears to have a planar wavefront for all intents and purposes. However, when the acoustic wave has propagated much further away from transmitting acoustic transducer 110, in the "far-field," the acoustic wave assumes a spherical wavefront. So, as a simplification, we can consider that as the acoustic wave propagates away from the transmitting acoustic transducer 110, at first its wavefront is generally planar until it reaches a near-to-far field transition point beyond which the wavefront becomes spherical. For a square acoustic transducer 110 having an side length W, then the near-to-far field transition point is at a distance, P, from transmitting acoustic transducer 110:

$$P = \left(\frac{W}{2}\right)^2 * \frac{1}{\lambda} \quad (1)$$

where $\lambda$ is the wavelength of the signal.

Accordingly, after passing the near-to-far field transition point, P, the acoustic wave has a spherical wavefront. However, receiving acoustic transducer 120 has a generally planar surface. As a result, as can be seen in FIG. 1, different portions of the wavefront of the acoustic wave reach receiving acoustic transducer 120 at different times. In other words, parts of the acoustic wave reach receiving acoustic transducer 120 out of phase with each other, resulting in self-interference and partial cancellation of the received acoustic wave at receiving acoustic transducer 120. For example, as seen in FIG. 1, when a first portion of the acoustic wavefront reaches receiving acoustic transducer 120, a second portion of the acoustic wavefront still has to travel a distance "d" before it will reach receiving acoustic transducer 120. Now if d is $\lambda/2$, then it is clear that the second portion of the acoustic wavefront reaches receiving acoustic transducer 120 exactly 180 degrees out of phase with the first portion of the wavefront, resulting in cancellation between the two portions.

Furthermore, due to the spherical spreading of the acoustic wave as it propagates, some of the acoustic beam will miss the receiving acoustic transducer altogether.

As a result of these two effects, the insertion loss of acoustic power transformer 100 is increased, resulting in a signal reduction at receiving acoustic transducer 120. Also, it can be seen form equation (1) above that this insertion loss decreases at higher frequencies.

What is needed, therefore, is an acoustic power transformer able to operate with lower insertion loss.

SUMMARY

In an example embodiment, an acoustic power transformer comprises: an input port adapted to receive an input signal; a transmitting acoustic transducer coupled to the input port and adapted to transmit an acoustic wave in response to the input signal received at the input port; a receiving acoustic transducer adapted to receive the acoustic wave and in response thereto to produce an output signal; an output port adapted to output the output signal; and an acoustic wave propagation medium disposed in an acoustic wave propagation path between the transmitting acoustic transducer and the receiving acoustic transducer. At least one of the transmitting acoustic transducer and receiving acoustic transducer includes a Fresnel lens In another example embodiment, an acoustic power transformer comprises: an input port adapted to receive an input signal; a transmitting acoustic transducer coupled to the input port and adapted to transmit an acoustic wave in response to the input signal received at the input port; a receiving acoustic transducer adapted to receive the acoustic wave and in response thereto to produce an output signal; an output port adapted to output the output signal; an acoustic medium disposed in an acoustic wave propagation path between the transmitting acoustic transducer and the receiving acoustic transducer; and an acoustic lens disposed in the acoustic wave propagation path between the transmitting acoustic transducer and the receiving acoustic transducer for focusing the transmitted acoustic wave onto the receiving acoustic transducer.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, example embodiments disclosing specific details are set forth in order to provide a thorough understanding of an embodiment according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparati and methods may be omitted so as to not obscure the description of the example embodiments. Such methods and apparati are clearly within the scope of the present teachings.

Figure 1A:
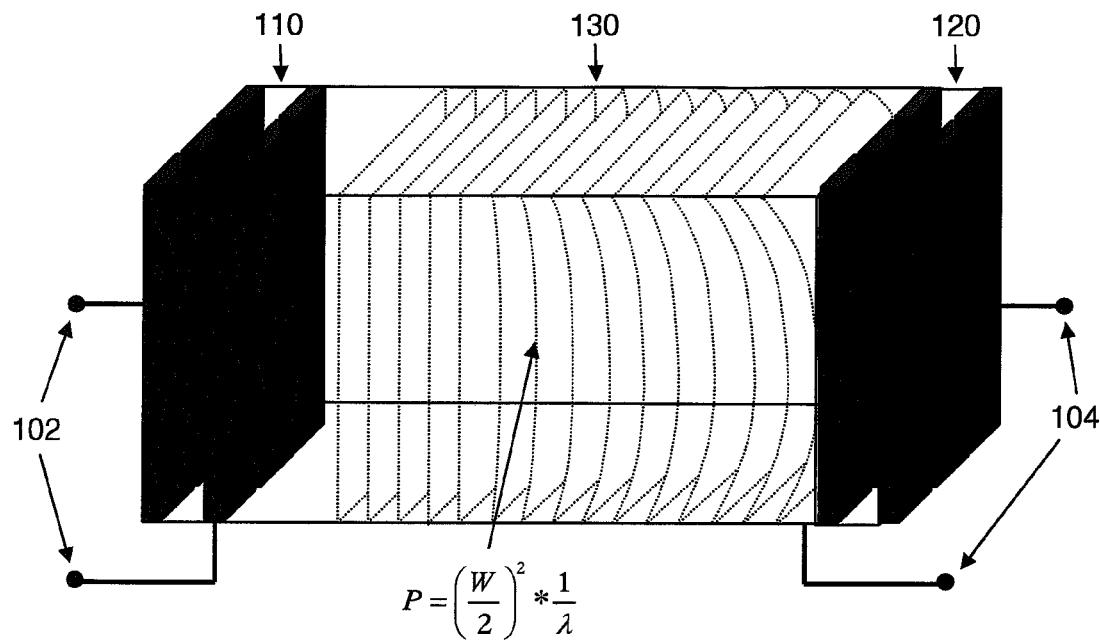
FIGS. 1A-B illustrate an exemplary acoustic power transformer.
Figure 1B:
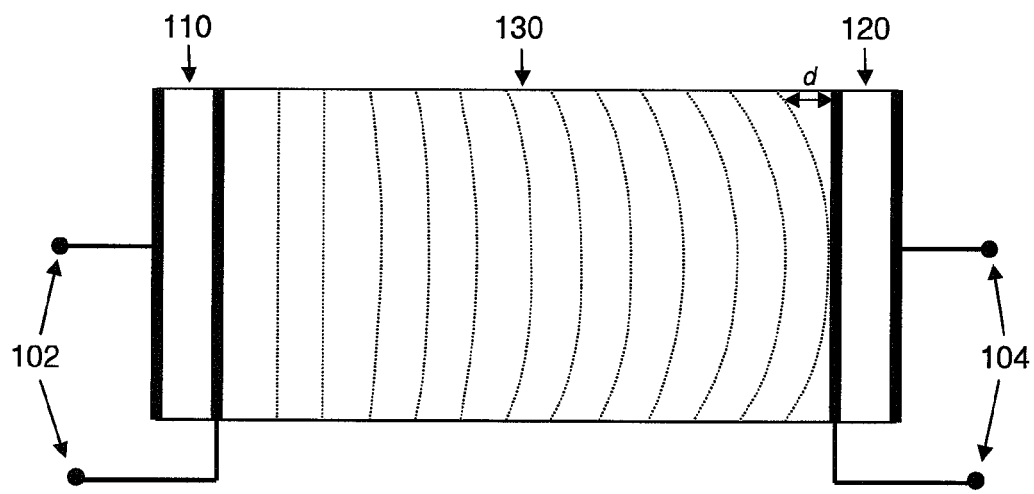
Figure 2:
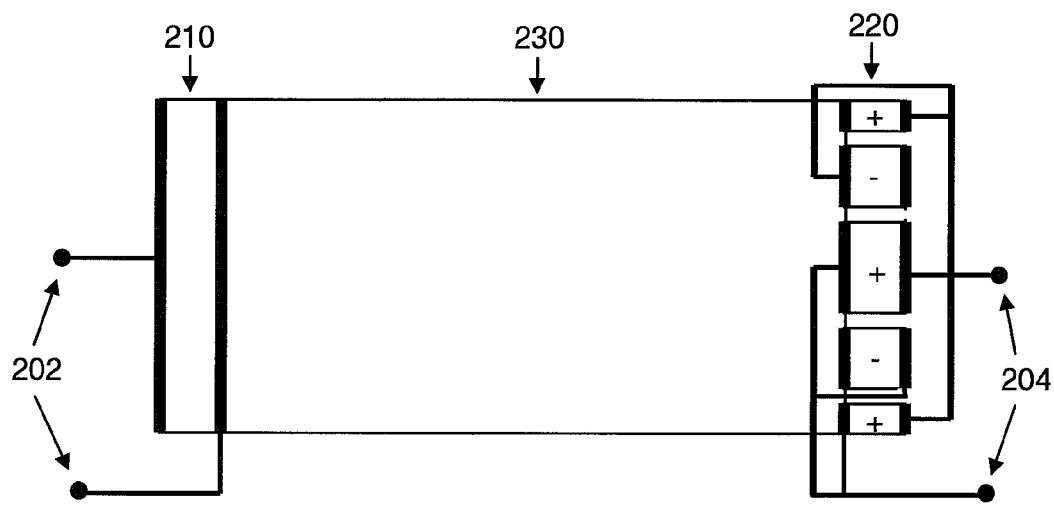
FIG. 2 illustrates one embodiment of an acoustic power transformer including an acoustic lens.

FIG. 2 illustrates one embodiment of an acoustic power transformer 200 including an acoustic lens. Acoustic power transformer 200 includes an input port 202, an output port 204, a transmitting acoustic transducer 210, a receiving acoustic transducer 220, and an acoustic wave propagation medium 230 disposed in an acoustic wave propagation path between transmitting acoustic transducer 210 and receiving acoustic transducer 220.

Transmitting acoustic transducer 210 and receiving acoustic transducer 220 may be piezoelectric devices adapted to convert a high frequency signal (e.g., an RF or microwave signal) to an acoustic wave, and vice versa. In one embodiment, transmitting acoustic transducer 210 and receiving acoustic transducer 220 each comprise a small "patch" of PZT, for example 1 mm×1 mm square patch.

Acoustic wave propagation medium 230 may be a material such as alumina, or another insulating material such as aluminum nitride, glass, quartz, etc.

Input port 202 includes a first and second terminal connected, respectively, to first and second electrodes of transmitting acoustic transducer 210.

Receiving acoustic transducer 220 includes an acoustic lens, in particular, a Fresnel lens. In general, Fresnel lenses achieve focusing by either blocking the portions of the acoustic wave that would be out of phase, or by providing a discrete phase shift over one or more portions of the acoustic wave so that all portions of the acoustic wave arrive within 90 degrees in phase of each other.

Figure 3:
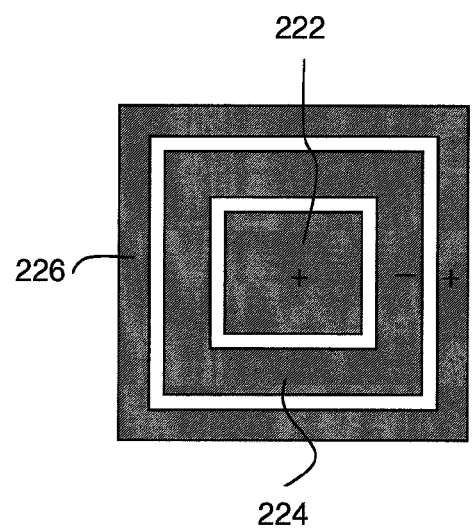
FIG. 3 shows a receiving acoustic transducer that may be employed in the acoustic power transformer of FIG. 2.

FIG. 3 shows an end view of one embodiment of receiving acoustic transducer 220. As best seen in FIG. 3, receiving acoustic transducer 220 includes a first acoustic transducer element 222, a second acoustic transducer element 224 substantially surrounding first acoustic transducer element 222, and a third acoustic transducer element 226 substantially surrounding second acoustic transducer element 224. First acoustic transducer element 222 is poled to have a first polarity (e.g., "+"), second acoustic transducer element 224 is poled to have a second polarity opposite the first polarity (e.g., "−"), and third acoustic transducer element 226 is poled to have the first polarity (e.g., "+"). Of course it is understood that the first and second polarities may be reversed. The transducer elements may be poled by a DC voltage across the first electrodes of the transducer element while applying heat to the transducer element.

First, second, and third acoustic transducer elements 222, 224 and 226 each have a first electrode on the same first side of receiving acoustic transducer 220 as each other, and a second electrode on the same second side of receiving acoustic transducer 220 as each other (opposite the first side of receiving acoustic transducer 220 where the first electrodes are located).

Output port 204 includes a first and second terminal. The first terminal of output port 204 is connected to the second electrodes of first and third acoustic transducer elements 222 and 226, and to the first electrode of second acoustic transducer element 224. Meanwhile, the second terminal of output port 204 is connected to the first electrodes of first and third acoustic transducer elements 222 and 226, and to the second electrode of second acoustic transducer element 224.

In operation, an input signal (e.g., an RF or microwave signal) is applied to input port 202 and thereby applied across the electrodes of transmitting acoustic transducer 210. In response to the input signal, transmitting acoustic transducer 210 generates an acoustic wave which is launched into the acoustic wave propagation medium 230. Since acoustic transformer 200 is a reciprocal device, the input and output may be switched.

First acoustic transducer element 222 of receiving acoustic transducer 220 receives a first (e.g., central) portion of the acoustic wave and in response thereto, generates an output signal (e.g., an RF or microwave signal) which is applied to the first and second terminals of output port 204 in a first phase relationship. Second acoustic transducer element 224 of receiving acoustic transducer 220 receives a second portion of the acoustic wave which is delayed in phase with respect to the first portion of the acoustic wave, and in response thereto generates an output signal which is applied to the first and second terminals of output port 204 in a second phase relationship which is opposite the first phase relationship. Third acoustic transducer element 226 receives a third portion of the acoustic wave which is delayed in phase with respect to the second portion of the acoustic wave and in response thereto, generates an output signal which is applied to the first and second terminals of output port 204 in the first phase relationship.

In this manner, second acoustic transducer element 224 is able to compensate for the delayed phase of the second portion of the acoustic wave with respect to the first portion of the acoustic wave by reversing the phase of the received second portion of the acoustic wave with respect to the received first portion of the acoustic wave. Similarly, third acoustic transducer element 226 is able to compensate for the delayed phase of the third portion of the acoustic wave with respect to the second portion of the acoustic wave by reversing the phase of the received third portion of the acoustic wave with respect to the received second portion of the acoustic wave.

Although receiving acoustic transducer 220 in acoustic power transformer 200 includes three acoustic transducer elements for illustration, it should be understood that in some embodiments, only two acoustic transducer elements may be employed, or more than the acoustic transducer elements may be employed. In general, the Fresnel lens is designed by determining regions of the acoustic wavefront where the phase shift is within a desired +/−tolerance, such as +/−90 degrees for a coarse lens, +/−45 degrees for a better lens, +/−22.5 degrees for an even better lens, etc. As one progresses away from the center of the wavefront, the rate of change of the phase shift increases and the size of a region with a phase shift within a given tolerance decreases. As a result, the Fresnel lens may comprise a series of acoustic transducer elements as concentric circles, nested rectangles, or other stacking shapes, with the width of the acoustic transducer elements monotonically decreasing from the central acoustic transducer element to the outermost acoustic transducer element "ring."

In one exemplary embodiment of a square-shaped receiving acoustic transducer having length W on each side, with only two acoustic transducer elements, one nested inside the other, the length, W1, of each side of the inner acoustic transducer element may be:

$$W1 \cong \frac{\sqrt{2}}{2} W \cong 0.7W \quad (2)$$

In that case the width, W2, of the outer acoustic transducer element may be:

$$W2 \cong \left(1 - \frac{\sqrt{2}}{2}\right) W \cong 0.3W \quad (3)$$

Accordingly, acoustic power transformer 200 is able to transfer high frequency energy from input post 202 to output port 204 while maintaining DC isolation between the two ports and with reduced insertion loss.

In acoustic power transformer 200 of FIG. 2 only receiving acoustic transducer 220 includes the Fresnel lens, and transmitting acoustic transducer 210 is a "regular" transducer. However, it should be understood that in alternate embodiments, only the transmitting acoustic transducer may include the Fresnel lens, and the receiving acoustic transducer may be a "regular" transducer, or both the transmitting acoustic transducer and the receiving acoustic transducer may include the Fresnel lens.

Figure 4:
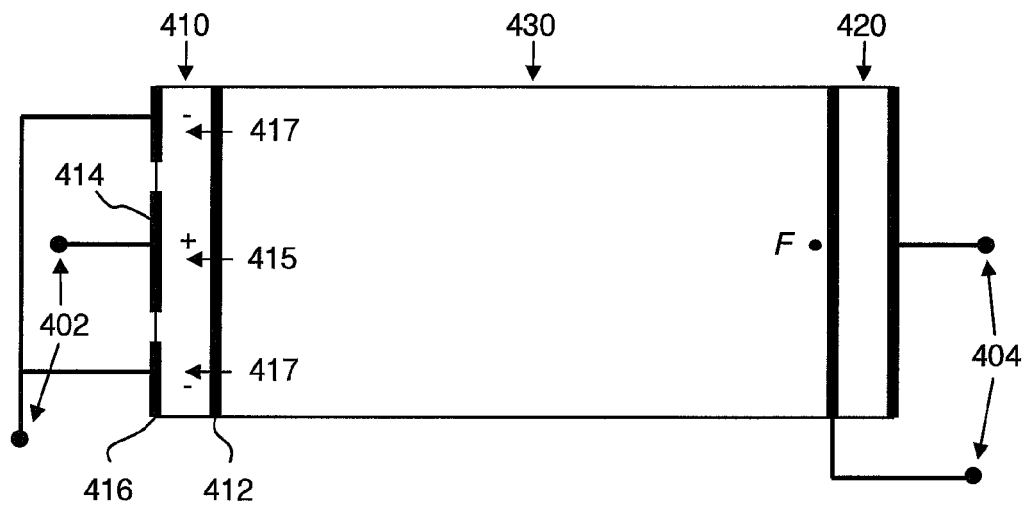
FIG. 4 illustrates another embodiment of an acoustic power transformer including an acoustic lens.

FIG. 4 illustrates another embodiment of an acoustic power transformer 400 including an acoustic lens. Acoustic power transformer 400 includes an input port 402, an output port 404, a transmitting acoustic transducer 410, a receiving acoustic transducer 420, and an acoustic wave propagation medium 430 disposed in an acoustic wave propagation path between transmitting acoustic transducer 410 and receiving acoustic transducer 420.

Transmitting acoustic transducer 410 and receiving acoustic transducer 420 may be piezoelectric devices adapted to convert a high frequency signal (e.g., an RF or microwave signal) to an acoustic wave, and vice versa. In one embodiment, transmitting acoustic transducer 410 and receiving acoustic transducer 420 each comprise a small "patch" of PZT, for example 1 mm×1 mm square patch.

Acoustic wave propagation medium 430 may be a material such as alumina, or other insulator such as aluminum nitride, glass, quartz, etc.

Transmitting acoustic transducer 410 includes an acoustic lens, in particular, a Fresnel lens. Transmitting acoustic transducer 410 includes a first electrode 412 disposed on a first side thereof, a second electrode 414 disposed on a second side thereof, and a third electrode 416 disposed on a second side thereof and surrounding second electrode 414.

Transmitting acoustic transducer 410 also includes a first acoustic transducer portion 415 and a second acoustic transducer portion 417 substantially surrounding first acoustic transducer portion 415. First acoustic transducer portion 415 is disposed between first electrode 412 and second electrode 414, and second acoustic transducer portion 417 is disposed between first electrode 412 and third electrode 416. First acoustic transducer portion 415 is poled to have a first polarity (e.g., "+"), and second acoustic transducer element 417 is poled to have a second polarity opposite the first polarity (e.g., "−"). Of course it is understood that the first and second polarities may be reversed.

Input port 402 includes a first and second terminal. The first terminal of input port 402 is connected to second electrode 414, and the second terminal of input port 402 is connected to third electrode 416.

In operation, an input signal (e.g., an RF or microwave signal) is applied to input port 402 and thereby applied across the electrodes of transmitting acoustic transducer 410. In response to the input signal, transmitting acoustic transducer 410 generates an acoustic wave which is launched into the acoustic wave propagation medium 430.

In operation, an input signal (e.g., an RF or microwave signal) is applied to input port 402 and thereby applied across electrodes 414 and 416 of transmitting acoustic transducer 410. In response to the input signal, transmitting acoustic transducer 410 generates an acoustic wave which is launched into the acoustic wave propagation medium 430, which is ultimately received by receiving acoustic transducer 420.

Because the input signal applied to second acoustic transducer portion 417 is out of phase with respect to the input signal applied to first acoustic transducer portion 415, the portion of the acoustic wave launched from the second acoustic transducer portion 417 is also out of phase with respect to the portion of the acoustic wave applied to first acoustic transducer portion 415. As a result, transmitting acoustic transducer 410 implements a Fresnel lens which focuses the acoustic wave at a focus plane F.

In the case of acoustic power transformer 400, the plane F is designed to align with receiving acoustic transducer 420.

However, in another embodiment, the focal plane F is designed to be in the middle of acoustic wave propagation medium, halfway between the transmitting acoustic transducer and the receiving acoustic transducer. In that case, the transmitting acoustic transducer and the receiving acoustic transducer have similar or identical Fresnel lenses, such as was illustrated above with respect to transmitting acoustic transducer 410 of FIG. 4.

In yet another embodiment, the focal plane F is designed to be at some other place in the acoustic wave propagation path between transmitting acoustic transducer and receiving acoustic transducer. In that case, the transmitting acoustic transducer and the receiving acoustic transducer also each include a Fresnel lens, but the Fresnel lenses of the two acoustic transducers are dissimilar from each other.

Figure 5:
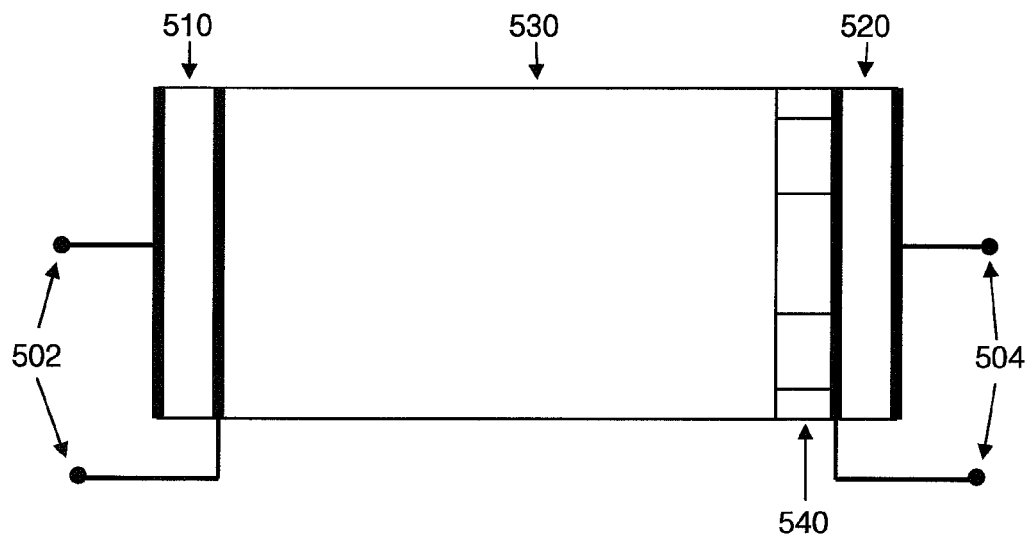
FIG. 5 illustrates yet another embodiment of an acoustic power transformer including an acoustic lens

FIG. 5 illustrates yet another embodiment of an acoustic power transformer 500 including an acoustic lens. Acoustic power transformer 500 includes an input port 502, an output port 504, a transmitting acoustic transducer 510, a receiving acoustic transducer 520, an acoustic wave propagation medium 530 disposed in an acoustic wave propagation path between transmitting acoustic transducer 510 and receiving acoustic transducer 520, and an acoustic lens 540.

Transmitting acoustic transducer 510 and receiving acoustic transducer 520 may be piezoelectric devices adapted to convert a high frequency signal (e.g., an RF or microwave signal) to an acoustic wave, and vice versa. In one embodiment, transmitting acoustic transducer 510 and receiving acoustic transducer 520 each comprise a small "patch" of PZT, for example 1 mm×1 mm square patch.

Acoustic wave propagation medium 530 may be a material such as alumina.

In acoustic power transformer 500, acoustic lens 540 is a Fresnel lens. In particular, acoustic lens 540 comprises a stack of at least two different materials having different acoustic propagation velocities, all having substantially the same thickness as measured in the direction of propagation of the acoustic wave, and stacked on each other transverse to the acoustic wave propagation path. The thickness of acoustic lens 540 and the various materials in the stack are selected to provide a desired phase shift of the acoustic wave across adjacent materials in the stack.

In acoustic power transformer 500, acoustic lens 540 is disposed adjacent to receiving acoustic transducer 520. However, it is understood that the acoustic lens could be disposed adjacent the transmitting acoustic transducer, or at another convenient location. Furthermore, although transmitting acoustic transducer 510 and receiving acoustic transducer 520 in acoustic power transformer 500 are "conventional" acoustic transducers, it should be understood that in another embodiment, an acoustic power transformer may include both an acoustic lens such as the acoustic lens 540, and the transmitting acoustic transducer and/or the receiving acoustic transducer may also include Fresnel lens, such as the receiving acoustic transducer 220 of FIG. 2, or the transmitting acoustic transducer 410 of FIG. 4.

Figure 6:
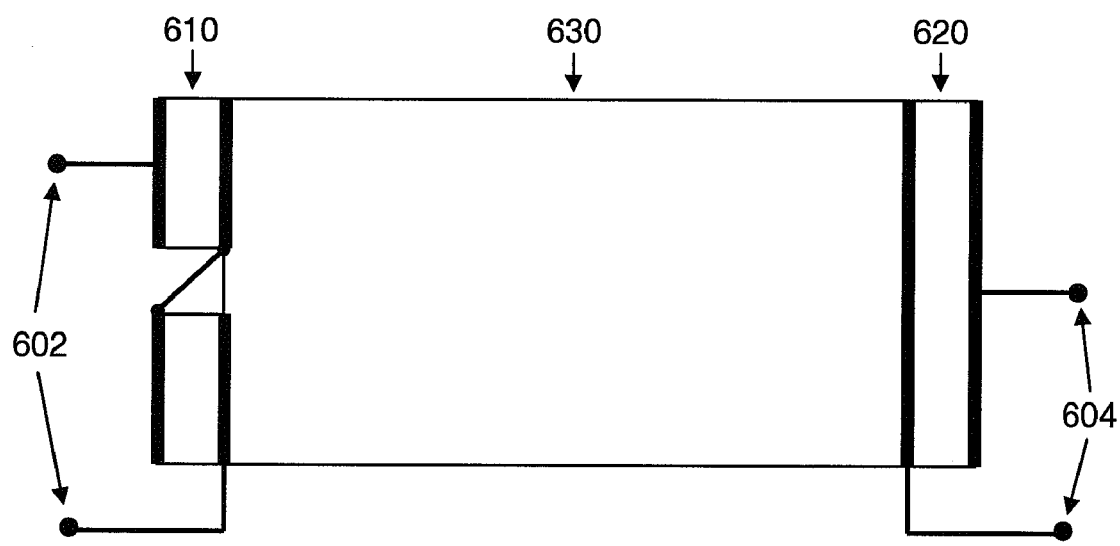
FIG. 6 illustrates still another embodiment of an acoustic power transformer including an acoustic lens.

FIG. 6 illustrates still another embodiment of an acoustic power transformer 600 including an acoustic lens. Acoustic power transformer 600 includes an input port 602, an output port 604, a transmitting acoustic transducer 610, a receiving acoustic transducer 620, an acoustic wave propagation medium 630 disposed in an acoustic wave propagation path between transmitting acoustic transducer 610 and receiving acoustic transducer 620, and an acoustic lens 640 disposed adjacent to receiving acoustic transducer 620.

Transmitting acoustic transducer 610 and receiving acoustic transducer 620 may be piezoelectric devices adapted to convert a high frequency signal (e.g., an RF or microwave signal) to an acoustic wave, and vice versa. In one embodiment, transmitting acoustic transducer 610 and receiving acoustic transducer 620 each comprise a small "patch" of PZT, for example 1 mm×1 mm square patch.

Acoustic wave propagation medium 630 may be a material such as alumina.

Input port 602 includes a first and second terminal. Transmitting acoustic transducer 610 includes a first acoustic transducer element 612 and a second acoustic transducer element 614 connected in series between the first and second terminals of input port 602. Output port 604 includes a first and second terminal. Receiving acoustic transducer 620 includes a first acoustic transducer element 622 and a second acoustic transducer element 624 connected in parallel between the first and second terminals of output port 604.

In operation, acoustic power transformer 600 is a step-down transformer, with the output voltage at output port 604 equal to half the input voltage at input port 602.

Including a Fresnel lens in an acoustic power transformer presents several advantages as described above, including the "planar" format, the flat shape of the elements, the ability to vary a material property such as poling direction to achieve a desired phase shift, or acoustic propagation velocity and thickness of stacked materials to achieve a desired focusing. As a result, an acoustic wave can be more efficiently delivered from a transmitting acoustic transducer across an acoustic wave propagation medium to a receiving acoustic transducer, yielding an acoustic power transformer that may operate with lower insertion loss.

While example embodiments are disclosed herein, one of ordinary skill in the art appreciates that many variations that are in accordance with the present teachings are possible and remain within the scope of the appended claims. The embodiments therefore are not to be restricted except within the scope of the appended claims.

The invention claimed is:

1. An acoustic power transformer, comprising:
an input port adapted to receive an input signal;
a transmitting acoustic transducer coupled to the input port and adapted to transmit an acoustic wave in response to the input signal received at the input port;
a receiving acoustic transducer adapted to receive the acoustic wave and in response thereto to produce an output signal;
an output port adapted to output the output signal; and
an acoustic wave propagation medium disposed in an acoustic wave propagation path between the transmitting acoustic transducer and the receiving acoustic transducer,
wherein at least one of the transmitting acoustic transducer and receiving acoustic transducer includes a Fresnel lens.

2. The acoustic power transformer of claim 1, wherein the Fresnel lens includes:
a first acoustic transducer element poled to have a first polarity; and
a second acoustic transducer element substantially surrounding the first acoustic transducer element and poled to have a second polarity opposite the first polarity.

3. The acoustic power transformer of claim 2, wherein the Fresnel lens further includes a third portion acoustic transducer element substantially surrounding the second acoustic transducer element and poled to have the first polarity.

4. The acoustic power transformer of claim 1, wherein at least one of the transmitting acoustic transducer and the receiving acoustic transducer comprises a first acoustic transducer element and a second acoustic transducer element connected in series between a first terminal and a second terminal of one of the input port and output port.

5. The acoustic power transformer of claim 4, wherein at least another one of the transmitting acoustic transducer and the receiving acoustic transducer comprises a first acoustic transducer element and a second acoustic transducer element connected in parallel between a first terminal and a second terminal of the other of the input port and output port.

6. The acoustic power transformer of claim 1, wherein at least one of the transmitting acoustic transducer and the receiving acoustic transducer comprises:
a first electrode disposed on a first side of the acoustic transducer;
a second electrode disposed on a second side of the acoustic transducer;

a first acoustic transducer portion poled to have a first polarity and disposed between the first electrode and the second electrode;

third electrode disposed on a second side of the acoustic transducer, the third electrode surrounding the second electrode; and a second acoustic transducer portion poled to have a second polarity and disposed between the first electrode and the third electrode;

wherein the second electrode is connected to a first terminal of one of the input port and output port, and wherein the third electrode is connected to a second terminal of the one of the input port and output port.

7. The acoustic power transformer of claim 1, wherein the acoustic wave propagation medium is alumina.

8. The acoustic power transformer of claim 1, wherein the transmitting acoustic transducer and receiving acoustic transducer both include a Fresnel lens.

9. The acoustic power transformer of claim 1, further comprising an acoustic lens disposed in the acoustic wave propagation path between the transmitting acoustic transducer and the receiving acoustic transducer.

10. The acoustic power transformer of claim 9, wherein the acoustic lens is a Fresnel lens.

11. The acoustic power transformer of claim 10, wherein the acoustic lens includes a stack of at least two different materials having two different acoustic propagation velocities, stacked transverse to the acoustic wave propagation path.

12. The acoustic power transformer of claim 1, wherein the transmitting acoustic transducer and receiving acoustic transducer are both piezoelectric devices.

13. An acoustic power transformer, comprising:

an input port adapted to receive an input signal;

a transmitting acoustic transducer coupled to the input port and adapted to transmit an acoustic wave in response to the input signal received at the input port;

a receiving acoustic transducer adapted to receive the acoustic wave and in response thereto to produce an output signal;

an output port adapted to output the output signal;

an acoustic medium disposed in an acoustic wave propagation path between the transmitting acoustic transducer and the receiving acoustic transducer; and an acoustic lens disposed in the acoustic wave propagation path between the transmitting acoustic transducer and the receiving acoustic transducer for focusing the transmitted acoustic wave onto the receiving acoustic transducer.

14. The acoustic power transformer of claim 13, wherein the acoustic lens is a Fresnel lens.

15. The acoustic power transformer of claim 14, wherein the acoustic lens includes a stack of at least two different materials having two different acoustic propagation velocities, stacked transverse to the acoustic wave propagation path.

16. The acoustic power transformer of claim 13, wherein the acoustic wave propagation medium is alumina.

17. The acoustic power transformer of claim 13, wherein the transmitting acoustic transducer and receiving acoustic transducer are both piezoelectric devices.

* * * * *

UNITED STATES PATENT AND TRADEMARK OFFICE
CERTIFICATE OF CORRECTION

PATENT NO. : 7,613,076 B2
APPLICATION NO. : 11/755825
DATED : November 3, 2009
INVENTOR(S) : John D. Larson, III It is certified that error appears in the above-identified patent and that said Letters Patent is hereby corrected as shown below:

Column 9, Line 4, Claim 6, before "third" insert -- a --.

Signed and Sealed this
Twenty-sixth Day of February, 2013

Teresa Stanek Rea
*Acting Director of the United States Patent and Trademark Office*